US012307124B2

(12) United States Patent
Pedretti et al.

(10) Patent No.: US 12,307,124 B2
(45) Date of Patent: *May 20, 2025

(54) ENHANCED k-SAT SOLVER USING ANALOG CONTENT ADDRESSABLE MEMORY

(71) Applicant: Hewlett Packard Enterprise Development LP, Spring, TX (US)

(72) Inventors: Giacomo Pedretti, Verbania (IT); John Paul Strachan, San Carlos, CA (US); Thomas Maurits M. Van Vaerenbergh, Flemish Brabant (BE); Catherine E. Graves, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/418,825

(22) Filed: Jan. 22, 2024

(65) Prior Publication Data

US 2024/0184479 A1 Jun. 6, 2024

Related U.S. Application Data

(63) Continuation of application No. 17/691,642, filed on Mar. 10, 2022, now Pat. No. 11,899,965.

(51) Int. Cl.
*G06F 3/06* (2006.01)
*G06N 3/063* (2023.01)

(52) U.S. Cl.
CPC .......... *G06F 3/0655* (2013.01); *G06F 3/0604* (2013.01); *G06F 3/0673* (2013.01); *G06N 3/063* (2013.01)

(58) Field of Classification Search
None
See application file for complete search history.

(56) References Cited

U.S. PATENT DOCUMENTS 7,206,212 B1 4/2007 Chou
7,565,634 B1 * 7/2009 Boyd ................. G05B 19/0421
716/106

(Continued)

OTHER PUBLICATIONS

SATLIB—Benchmark Problems< available online at <https://web.archive.org/web/20220404084854/https://www.cs.ubc.ca/~hoos/SATLIB/benchm.html>, Apr. 4, 2022, 4 pages.

(Continued)

*Primary Examiner* — Michael Alsip
(74) *Attorney, Agent, or Firm* — Hewlett Packard Enterprise Patent Department (57) ABSTRACT

A system for facilitating an enhanced k-SAT solver is provided. The system can include a set of analog content addressable memory (aCAM) modules that can represent an expression in a conjunctive normal form (CNF), wherein a respective aCAM module corresponds to a clause of the expression. The system can also include a set of data lines that can provide input candidate values to the set of aCAM modules. A controller of the system can program the set of aCAM modules with respective analog values to represent the expression. The system can also include sensing logic block to determine a distance of a current solution from a target solution based on a combination of respective outputs from the set of aCAM modules. The controller can then iteratively modify an input value for a subset of data lines until the current solution converges based on a convergence condition.

20 Claims, 10 Drawing Sheets

(56) References Cited

U.S. PATENT DOCUMENTS

| | | |
|---|---|---|
| 10,847,238 B2 | 11/2020 | Li et al. |
| 11,289,162 B2 | 3/2022 | Strachan et al. |
| 2019/0050720 A1 | 2/2019 | Binas et al. |
| 2019/0311267 A1 | 10/2019 | Qin et al. |
| 2019/0332708 A1 | 10/2019 | Strachan et al. |
| 2022/0375536 A1 | 11/2022 | Strachan et al. |
| 2023/0137079 A1 | 5/2023 | Pedretti et al. |

OTHER PUBLICATIONS

Wikipedia, "Boolean satisfiability problem", available online at <https://en.wikipedia.org/w/index.php?title=Boolean_satisfiability_problem&oldid=1064634994>, Jan. 9, 2022, 26 pages.

Yin et al., "Efficient Analog Circuits for Boolean Satisfiability", IEEE, 2017, pp. 1-13.

* cited by examiner

ENHANCED k-SAT SOLVER USING ANALOG CONTENT ADDRESSABLE MEMORY

CROSS-REFERENCE TO RELATED APPLICATIONS

This application is a continuation application of and claims priority to application Ser. No. 17/691,642, filed on Mar. 10, 2022, the contents of which are hereby incorporated by reference in their entireties.

RELATED APPLICATIONS

This application is related to U.S. Pat. No. 10,846,296, U.S. patent application Ser. No. 15/966,817, titled "K-SAT filter querying using ternary content-addressable memory," by inventors John Paul Strachan and Catherine E. Graves, issued 24 Nov. 2020; and U.S. patent application Ser. No. 17/326,223, titled "Analog Content Addressable Memory for Storing and Searching Arbitrary Segments of Ranges," by inventors John Paul Strachan, Can Li, and Catherine E. Graves, filed 20 May 2021, the disclosures of which are incorporated by reference herein.

BACKGROUND

Field

The present disclosure relates to problem-solving systems. More specifically, the present disclosure relates to a method and apparatus for facilitating an enhanced k-satisfiability (k-SAT) problem solver, which can be referred to as a k-SAT solver.

BRIEF DESCRIPTION OF THE FIGURES

In the figures, like reference numerals refer to the same figure elements.

DETAILED DESCRIPTION

The following description is presented to enable any person skilled in the art to make and use the technology, and is provided in the context of a particular application and its requirements. Various modifications to the disclosed examples will be readily apparent to those skilled in the art, and the general principles defined herein may be applied to other examples and applications without departing from the spirit and scope of the present invention. Thus, the present invention is not limited to the examples shown, but is to be accorded the widest scope consistent with the claims.

High-capacity devices, such as network switches, often use a content addressable memory (CAM) for high-throughput operations, such as address lookup for packet forwarding. Upon receiving a lookup input (e.g., a network address), the CAM can compare the input against a respective entry stored in the CAM to identify whether one or more pieces of data match the input. If the input matches a piece of data in an entry, the CAM can provide the corresponding address in the CAM. The CAM can be equipped with N search lines (SLs), each corresponding to a bit of the input. A respective bit of the input can be provided via a corresponding SL. This allows the CAM to perform a parallel search by comparing the input to a respective entry of the CAM in parallel. Any piece of data matching the input may be identified based on the voltage observed on a corresponding match line (ML). To facilitate the detection, a respective match line can be pre-charged to a high voltage, which is then discharged if the corresponding stored entry does not match the input. A respective match line maintaining the high voltage may indicate a match.

A ternary CAM, also referred to as a TCAM, can be implemented in volatile memory, such as a static random access memory (SRAM). The ternary information can be stored in two binary memory cells that together can represent any of three values: 0, 1, or a "don't care" value. An entry with a "don't care" value at a corresponding position of a bit may output a match at that bit position regardless of the value of the input at that position. Similarly, a respective bit of the input may take on a 0, 1, or a "don't care" value. A "don't care" value specified at a corresponding position of a bit in the input can match against any value that may be stored in the entry of the TCAM at that position. In this way, a TCAM can facilitate flexible storage and search using the "don't care" value.

One aspect of the present technology can provide a system for facilitating an enhanced k-SAT solver. The system can include a set of aCAM modules that can represent an expression in a conjunctive normal form (CNF), wherein a respective aCAM module corresponds to a clause of the expression. The system can also include a set of data lines that can provide input candidate values to the set of aCAM modules. A controller of the system can program the set of aCAM modules with respective analog values to represent the expression. The system can also include a sensing logic block to determine a distance of a current solution from a target solution based on a combination of respective outputs from the set of aCAM modules. The controller can then iteratively modify an input value for a subset of data lines until the current solution converges based on a convergence condition.

In a variation on this aspect, the distance includes a voltage distance. The convergence condition can include a voltage value of zero calculated based on the respective outputs.

In a variation on this aspect, a respective aCAM module includes a plurality of aCAM cells. A respective aCAM cell can be associated with a variable of a clause of the expression indicated by the aCAM module.

In a further variation, the aCAM cell includes one or more tunable resistance devices (TRDs). A respective TRD facilitates non-volatile storage of continuous analog value.

In a further variation, the TRD includes one or more of: a memristor, a memristor, a memtransistor, and a memory component in neuromorphic memory device.

In a variation on this aspect, the controller can also determine whether modifying the input value decreases the distance from the target solution based on the combination of the respective outputs.

In a further variation, the controller can increase or decrease the input value in response to sensing an increased distance from the target solution.

In a variation on this aspect, the system can include a gradient logic block that can, in response to the combination of the respective outputs not changing for a number of iterations, incorporate noise to the input candidate values, thereby facilitating gradient descent.

In a variation on this aspect, the set of aCAM modules can be organized in a hierarchical array, wherein a respective element of the hierarchical array comprises a subset of the aCAM modules.

In a further variation, the sensing logic block can also determine the combination of the respective outputs by adding respective outputs of the respective element of the hierarchical array.

The examples described herein solve the problem of facilitating an efficient k-SAT problem solver (or a k-SAT solver) by (i) allocating separate data lines (DLs) for a respective aCAM cell representing a variable for a respective clause; (ii) coupling the aCAM cells with a shared match line; and (iii) incorporating a sensing circuit for the current flowing into the discharge path of the aCAM cells for measuring how far the current candidate solution is from the target solution. The separate data lines and the shared match line allow the aCAM cells to represent the "OR" and "AND" operations, respectively, of a logical problem expressed in a Conjunctive Normal Form (CNF). The resultant enhanced k-SAT solver can efficiently determine the target (or correct) solution in the energy domain without requiring external calculations.

The k-SAT problem belongs to a class of NP-complete (nondeterministic polynomial-time complete) problems. The k-SAT problem includes determining a set of variables that satisfy a Boolean expression. The k-SAT problem can correspond to a number of industrial and scientific problems, such as design automation and cryptography. Typically, the Boolean expression is represented in a CNF form comprising the conjunction (or AND) of a set of clauses. A respective clause can include the disjunction of a set of variables (or literals). With existing technologies, exploring the solution space of the Boolean expression can be inefficient. Some approaches, such as Hopfield neural networks (HNN), may operate on computation-extensive gradient domain (i.e., rely on software-based computations). A corresponding circuit may be designed to verify whether a solution is correct. However, such a circuit may not facilitate efficient and scalable exploration of the solution space.

To solve this problem, an enhanced k-SAT solver can be facilitated by using aCAM. Typically, an aCAM can be used to store and search continuous values. The aCAM may include a set of cells arranged in an array of rows and columns. A respective cell can be referred to as an aCAM cell. A respective aCAM cell can be used to represent a piece of data (e.g., a range of values stored in the aCAM) for a respective search parameter/variable. For example, an aCAM cell can include a set of transistors and tunable resistance (or resistive) devices (TRDs). A TRD can be any device that can facilitate non-volatile memory, such as a memristor, a memristor, a memtransistor, or any memory component in a neuromorphic memory device that can be used for storing a continuous value, capable of facilitating resistive memory. A TRD can be a non-volatile memory device whose resistance can be programmable, and the programmed value can be storable. Unlike conventional memory cells storing binary or ternary values, a memristor can represent a continuous analog value. As a result, the value programmed in two memristors can be associated with a range (e.g., within two values or greater/less than a particular value). Hence, the conductance of a respective memristor can be tuned to represent lower and upper voltage bounds of a matching analog voltage range for the aCAM cell.

The aCAM cell can receive an input voltage applied to a data line of the aCAM cell. The aCAM cell can output a match if the input voltage of the data line is within the analog voltage range defined by the conductance of a respective TRD. Consequently, the range of values represented by the analog voltage range can be stored in the aCAM cell. Furthermore, the aCAM cell facilitates searching of the input voltage of the data line within the analog voltage range of the aCAM cell. In this way, the aCAM cell can store and search a particular analog range of values because an aCAM can enable flexible searching.

In addition, the aCAM cell may also facilitate storing and searching of independent range segments defined based on inequity (e.g., greater or less than a value). For example, the respective conductance of the TRDs of the aCAM cell can be programmed to represent the upper and lower bounds of the voltage range. The corresponding transistors can then be used to detect the thresholds of the upper and lower bounds. Hence, if the input value is less than the lower bound or greater than the upper bound, the aCAM cell can indicate a match. In other words, the aCAM cell can indicate a "true" value for the Boolean OR between the two search ranges.

The solver can include a set of aCAMs with a common or shared match line. A respective aCAM can correspond to a clause of the Boolean expression of the k-SAT problem in a CNF form. The aCAM can include an array of aCAM cells, each corresponding to a literal of the clause. Hence, the number of aCAM cells in an aCAM can correspond to the number of literals in the clause. A respective aCAM cell can be equipped with a separate data line. Based on the input voltage provided through the data line and the clauses stored in the aCAM cells, a corresponding transistor (e.g., a pull-down transistor) is turned on. Hence, the flow of current from the aCAM cell can indicate whether the input corresponds to a solution for the variable associated with the corresponding literal. Therefore, the flow of current from the aCAM can represent the disjunction of the variables of the corresponding clause of the Boolean expression.

In other words, the transistors can output a corresponding flow of current from the aCAM indicating the clause. In this way, a respective aCAM of the solver can output a flow of current. The solver can further incorporate a sensing circuit for the current flowing into the discharge path of the aCAMs for measuring how far the current candidate solution is from the target or correct solution. A controller of the solver can randomly select one of the data lines and increase the input voltage. If the new increased input voltage decreases the overall output voltage, the controller can use the new input voltage for the subsequent iteration. Otherwise, the controller can decrease the input voltage for the subsequent iteration. When the output voltage reaches a value of zero, the controller can determine that a solution is found.

The solver can be further enhanced using a gradient descent approach. If the Boolean expression is large or complex, the exploration process may be unable to reach the target solution. However, since the solver can directly track the energy and cost function at each iteration of the process. The solver can add a noise based on a predetermined distribution to the input voltage when the output voltage does not improve over a predetermined number of iterations (i.e., whenever the solution is not measured to improve after the predetermined number of cycles). This allows the solver to operate in the energy domain without requiring external computation for applying the gradient. In this way, the solver can efficiently traverse the solution space for the Boolean expression in the energy domain, thereby avoiding extensive computation.

Although k-SAT filtering with a CAM can be rapid, such filtering may not be readily applicable as a k-SAT solver. In contrast, the enhanced k-SAT solver can facilitate a generalized solution with the corresponding method and circuit for solving k-SAT problems using aCAMs. Furthermore, other circuit-based approaches, such as an HNN, an ising machine, and Boltzmann, require additional computations to determine the states in the energy domain. In particular, without extra calculations, such solutions may not determine whether a solution corresponds to a local or global minima, or the distance to the target (or correct) solution. The distance can be the voltage distance. Since the solver can directly measure the states of the energy domain with aCAMs, the solver can continue with the iterations with gradient descent until the output voltage reaches the target value of zero. For the same reason, the solver can be scalable without requiring complex communication patterns between different elements.

Figure 1A:
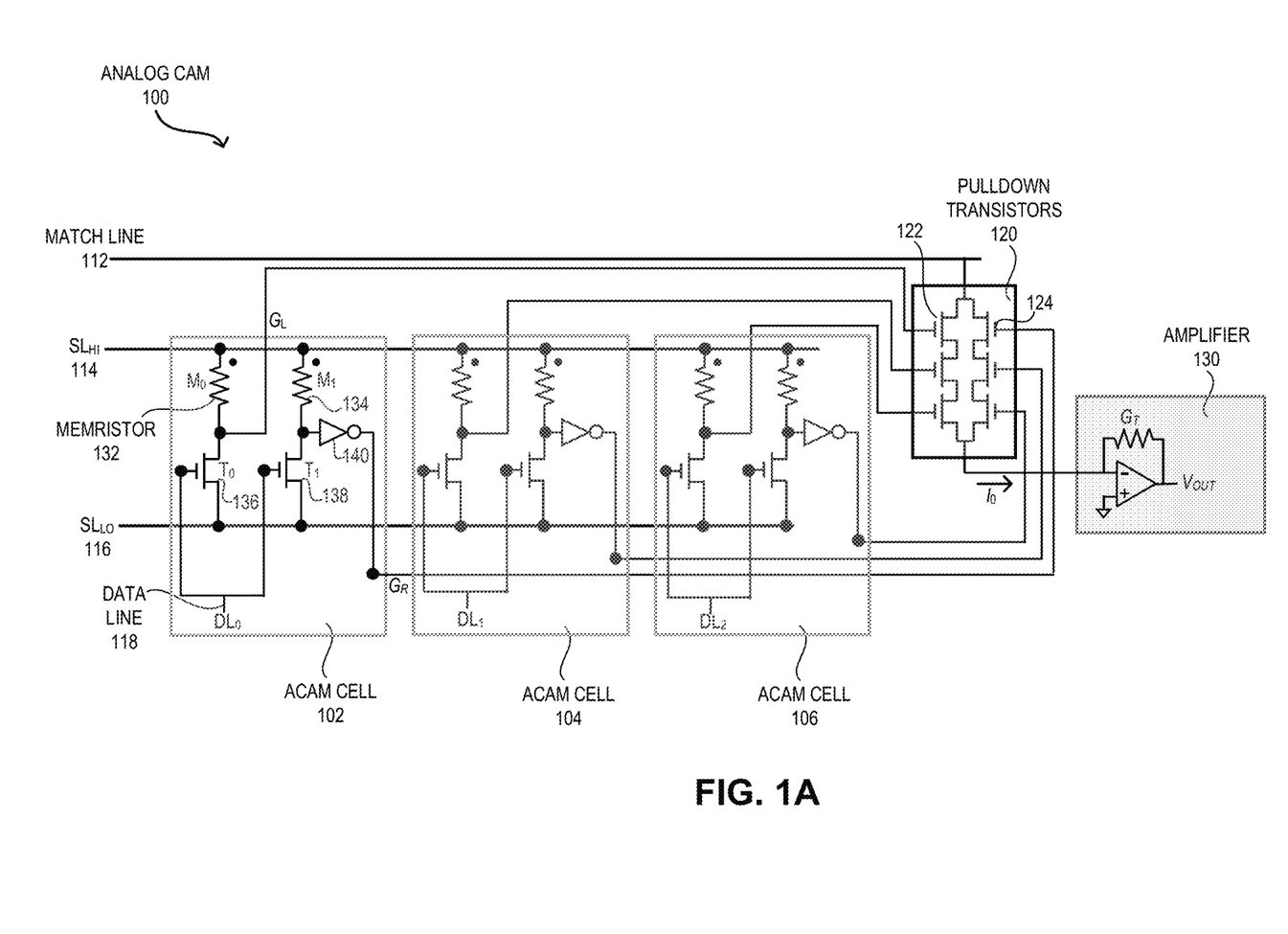
FIG. 1A illustrates an exemplary analog content addressable memory (aCAM) of an enhanced k-SAT solver, in accordance with an aspect of the present application.

FIG. 1A illustrates an exemplary aCAM of an enhanced k-SAT solver, in accordance with an aspect of the present application. An aCAM 100 can be used in an enhanced k-SAT solver. Here, aCAM 100 can correspond to a clause of the CNF representation of the Boolean expression to be solved by the k-SAT solver. In this example, aCAM 100 can include a number of aCAM cells 102, 103, and 104 arranged in an array of rows and columns. A respective cell can correspond to a variable of the clause. A respective cell, such as cell 102, can include TRDs, such as memristors 132 ($M_0$) and 134 ($M_1$). Cell 102 can also include transistors 136 ($T_0$) and 138 ($T_1$). Examples of a transistor can include, but are not limited to, various combinations of n-type and p-type transistors, including n-type metal oxide semiconductor (MOS) field-effect transistors (MOSFETs), and p-type MOSFETs.

Furthermore, aCAM 100 can include select lines 114 ($SL_{HI}$) and 116 ($SL_{HI}$), and a match line (ML) 122 shared among cells 102, 103, and 104. Cells 102, 103, and 104 obtain a corresponding input, which can be an input voltage, based on a corresponding data line $DL_0$, $DL_1$, and $DL_2$, respectively. Cell 102 can also include a voltage divider circuit comprising memristor 132 and transistor 136 connected in series, and another voltage divider circuit 104 comprising memristor 134 and transistor 138 connected in series. Memristors 132 and 134 can be connected to select line 114, and transistors 136 and 138 can be connected to another select line 116. Data line 118 ($DL_0$) of cell 102 can be split into respective voltages for feeding to the voltage divider circuits of cell 102.

Moreover, aCAM 100 can also include pulldown transistors 120, which can include transistors 122 and 124. Voltage $G_L$ can correspond to the gate voltage at transistor 122, and voltage $G_R$, which may correspond to the output of inverter logic gate 140, can correspond to the gate voltage at transistor 124. Instead of inverter 140, a pass transistor logic can be used. Respective voltages can be applied to the select lines 114 and 116 to activate cell 102, as well as cells 104 and 106. The select lines 114 and 116 can provide a voltage drop across the voltage divider circuits of cell 102.

The resistance across transistor 136 can determine, at least in part, the voltage $G_L$, which in turn, may determine the gate voltage at transistor 122. Similarly, the resistance across transistor 138 and the inversion facilitated by inverter 140 can determine, at least in part, the gate voltage $G_R$ at transistor 124. Match line 112 can be pre-charged to a high voltage and discharged if the respective gate voltages of transistors 122 and 124 are each greater than their respective threshold voltages. As a result, transistors 122 and 124 can turn on by transitioning to a low resistance state and discharge match line 126.

Figure 1B:
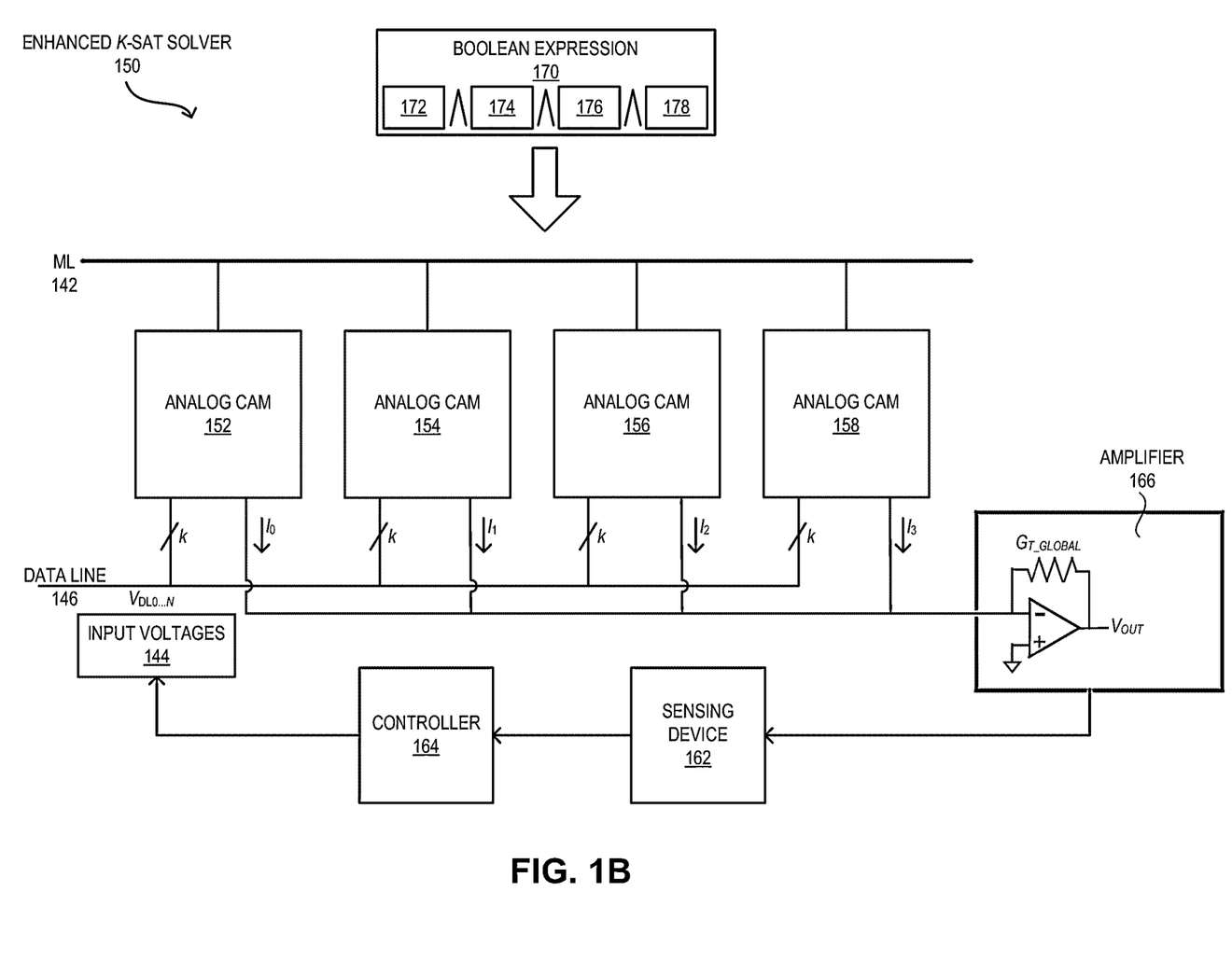
FIG. 1B illustrates an exemplary enhanced k-SAT solver formed based on aCAMs, in accordance with an aspect of the present application.

The same detection process is repeated for a respective transistor of pulldown transistors 120. The resultant flow of current, $I_O$, can pass through an amplifier 130 (e.g., a transimpedence amplifier or TIA). Instead of amplifier 130, the time to discharge match line 112 can be measured with a time-to-digital converter (TDC). Gate voltage $G_T$ can correspond to $I_0$ and provide the output, which is the output voltage $V_{OUT}$, of amplifier 130. $V_{OUT}$ can indicate whether the k-SAT solver has determined a solution. FIG. 1B illustrates an exemplary enhanced k-SAT solver formed based on aCAMs, in accordance with an aspect of the present application. In this example, enhanced k-SAT solver 150 can be formed based on aCAMs 152, 154, 156, and 158. A respective of these aCAMs can include an array of NaCAMs cells.

In solver 150, aCAMs 152, 154, 156, and 158 can share a common match line 142. A respective aCAM can correspond to a clause of an input Boolean expression 170 of the k-SAT problem. Boolean expression 170 can include N variables and clauses 172, 174, 176, and 178 in a conjunctive form. A respective clause of Boolean expression 170 can include k literals (N≥k) and may be represented by an aCAM of solver 150. For example, clauses 172, 174, 176, and 178 can correspond to aCAMs 152, 154, 156, and 158, respectively. It should be noted that solver 150 can be equipped with a greater number aCAMs than the number of clauses of an input Boolean expression. The other aCAMs of solver 150 (not shown in FIG. 1B) may remain unused. Unused aCAMs may be configured to be disabled.

A respective aCAM, such as aCAM 152, can include an array of aCAM cells, each corresponding to a literal of the corresponding clause 172. Hence, the number of aCAM cells of aCAM 152 can correspond to the k literals of clause 172. A respective aCAM cell of a respective aCAM can be equipped with a separate data line. Accordingly, a respective aCAM can have k data lines carrying k input voltages 144. Data line 146 can carry the same N input voltages 144 for solver 150. From data line 146, corresponding k inputs are provided to a respective aCAM via the data line of the aCAM. Based on input voltages 144 provided through data line 146, a corresponding transistor is turned on. Hence, the flow of current $I_0$, $I_1$, $I_2$, and $I_3$ from aCAMs 152, 154, 156, and 158, respectively, can indicate whether the input provided via data line 162 correspond to a solution for Boolean expression 170.

Therefore, the combination (e.g., based on an addition) of the flow of current $I_0$, $I_1$, $I_2$, and $I_3$ can represent the conjunction of the clauses of Boolean expression 170. The combination of flow of current $I_0$, $I_1$, $I_2$, and $I_3$ can be amplified by a transimpedence amplifier 166. Instead of amplifier 166, the time to discharge match line 142 can be measured with a TDC. It should be noted that a single amplifier 166 (or TDC) may be used for all aCAMs of solver 150. Gate voltage $G_{T\_GLOBAL}$ can correspond to a combination (e.g., an addition) of flow of current $I_0$, $I_1$, $I_2$, and $I_3$ and can provide the output voltage $V_{OUT}$ of amplifier 166. Solver 150 can further incorporate a sensing device 162, such as an analog to digital converter, to determine how far is the current input from the target (or correct) solution (i.e., the voltage distance from the target solution). Based on the distance, a controller 164 of solver 150 can randomly select one of the input voltages 144 and increase the selected input voltage.

If the new increased input voltage decreases $V_{OUT}$, controller 164 can use the new input voltage for the subsequent iteration. Otherwise, controller 164 can decrease the input voltage for the subsequent iteration. Solver 150 can then start from an initial set of input voltages and iteratively explore the solution space for Boolean expression 170. Based on a convergence condition (i.e., when $V_{OUT}$ reaches a value of zero), controller 164 determines that a solution has converged. The solution indicates a set of values for the variables of Boolean expression 170 that satisfies Boolean expression 170 (i.e., for which Boolean expression 170 is "true"). In this way, solver 150 can efficiently traverse the solution space for Boolean expression 170 in the energy domain, thereby avoiding extensive computation.

Although 3-SAT filtering, where k=3, with a CAM can be rapid, such filtering may not be readily applicable as a k-SAT solver. In contrast, solver 150 can facilitate a generalized solution with the corresponding method and circuit for solving k-SAT problems using aCAMs 152, 154, 156, and 158. Furthermore, other circuit-based approaches, such as an HNN, an ising machine, and Boltzmann, require additional computations to determine the states in the energy domain. In particular, without extra calculations, such solutions may not determine whether a solution corresponds to a local or global minima, or the distance to the target solution. Since solver 150 can directly measure the states of the energy domain with aCAMs, solver 150 can continue with the iterations with gradient descent until $V^{OUT}$ reaches the convergence or target value of zero (i.e., the solution has converged based on a convergence condition). For the same reason, solver 150 can be scalable without requiring complex communication patterns between different elements.

Figure 2:
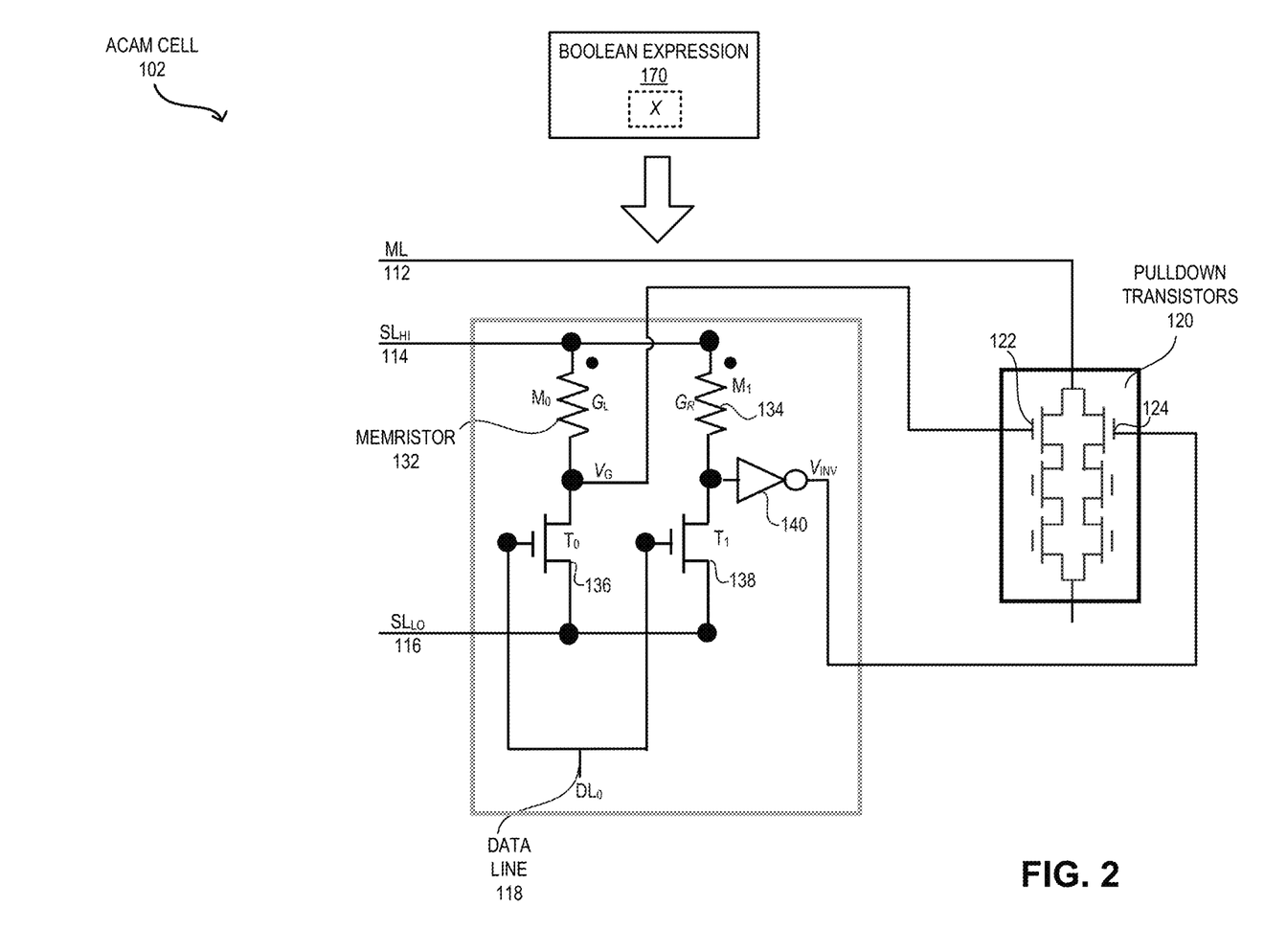
FIG. 2 illustrates an exemplary aCAM cell in an enhanced k-SAT solver, in accordance with an aspect of the present application.

Solver 150 can use a cell to explore the solution space of a corresponding variable for a particular clause represented by the aCAM hosting the cell. FIG. 2 illustrates an exemplary aCAM cell in an enhanced k-SAT solver, in accordance with an aspect of the present application. Suppose that cell 102 corresponds to a variable X of Boolean expression 170. Memristors 132 and 134 can be programmed (or encoded) with gate voltages $G_L$ and $G_R$, respectively, based on the polarity of X. In cell 102, a high voltage $G_{MAX}$ and a low voltage $G_{MIN}$ can be maintained to program a high and low voltage value for memristors 132 and 134. Furthermore, a predetermined voltage $G_P$ (e.g., 50 µs) can be used for programming memristors 132 and 134.

To represent X, $G_L$ and $G_R$ can be programmed with $G_P$ and $G_{MAX}$, respectively. Similarly, to represent X ("not X"), $G_L$ and $G_R$ can be programmed with $G_{MIN}$ and $G_P$, respectively. Subsequently, the initial input voltage, which can be based on a value selection policy, can be applied to data line 118 (i.e., an initial voltage for $DL_0$). Examples of the value selection policy can include, but are not limited to, random selection, previous-solution-based selection, empirical values, and a combination thereof. Based on the input, cell 102 can produce voltage $V_G$ based on $G_L$ and $V_{INV}$ as an output of inverter 140 based on $G_R$.

If cell 102 is programmed to represent X, $G_R$ can be $G_{MAX}$. As a result, $V_{INV}$ can remain low. Consequently, $V_{INV}$ does not turn on the corresponding pulldown transistor 124. If the input via data line 118, the voltage of $DL_0$ ($V_{DL0}$) increases, $V_G$ can decrease. As a result, the current flowing in the corresponding pulldown transistor 122 can reduce. Thus, a high $DL_0$ can indicate a match (e.g., $V_{DL0}$=1=X). On the other hand, if cell 102 is programmed to represent X, $G_L$ can be $G_{MIN}$, and hence, $V_G$ can remain low. Consequently, $V_G$ does not turn on the corresponding pulldown transistor 122. If the input via data line 118, $V_{DL0}$, decreases, $V_{INV}$ can decrease, thereby reducing the current flowing in the corresponding pulldown transistor 124. Thus, a low $DL_0$ can indicate a match (e.g., $V_{DL0}$=0=X).

Figure 3:
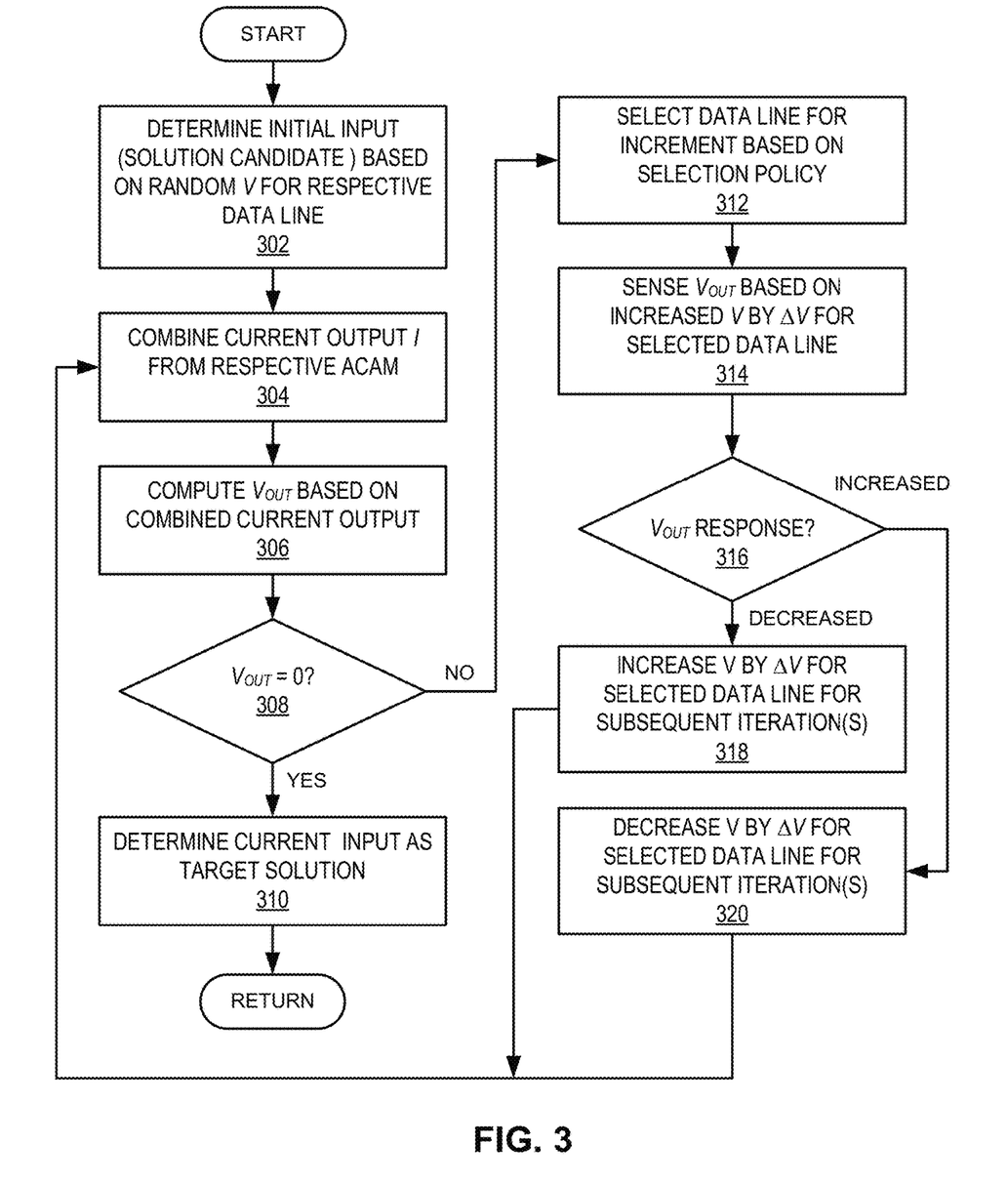
FIG. 3 presents a flowchart illustrating the process of an apparatus solving a k-SAT problem using aCAMs, in accordance with an aspect of the present application.

FIG. 3 presents a flowchart illustrating the process of an apparatus solving a k-SAT problem using aCAMs, in accordance with an aspect of the present application. The apparatus can include a k-SAT solver circuit and may traverse the solution space for a Boolean expression in a CNF form. During operation, the apparatus can determine the initial input (or initial solution candidate) based on a random V for a respective data line (operation 302) and combine (e.g., add) the current output I from a respective aCAM (operation 304). The apparatus can then compute $V_{OUT}$ based on the combined current output (operation 306) and determine whether $V_{OUT}$ has reached a value of 0 (i.e., whether $V_{OUT}$=0) (operation 308).

If $V_{OUT}$ reaches a value of 0, the traversal is complete. Hence, the apparatus can determine the current input (or current candidate solution) as the target solution (operation 310). On the other hand, if $V_{OUT}$ has not reached a value of 0, the apparatus can continue to the next iteration in the exploration of the solution space. To do so, the apparatus can select a data line for increment based on a selection policy (operation 312) and sense the $V_{OUT}$ based on the increased V by ΔV for the selected data line (operation 314). Examples of the selection policy can include, but are not limited to, random selection, round-robin selection, pattern-based selection (i.e., based on a predetermined pattern), and a combination thereof.

The apparatus can then determine the $V_{OUT}$ response based on the increased V (operation 316). If $V_{OUT}$ has decreased (i.e., became closer to the solution), the apparatus can increase V by ΔV for the selected data line for the subsequent iteration(s) (operation 318). On the other hand, if $V_{OUT}$ has increased (i.e., became further to the solution), the apparatus can decrease V by ΔV for the selected data line for the subsequent iteration(s) (operation 320). Upon incrementing or decrementing (operation 318 or 320, respectively), the apparatus can continue to combine (e.g., add) the current output I from a respective aCAM (operation 304).

Figure 4A:
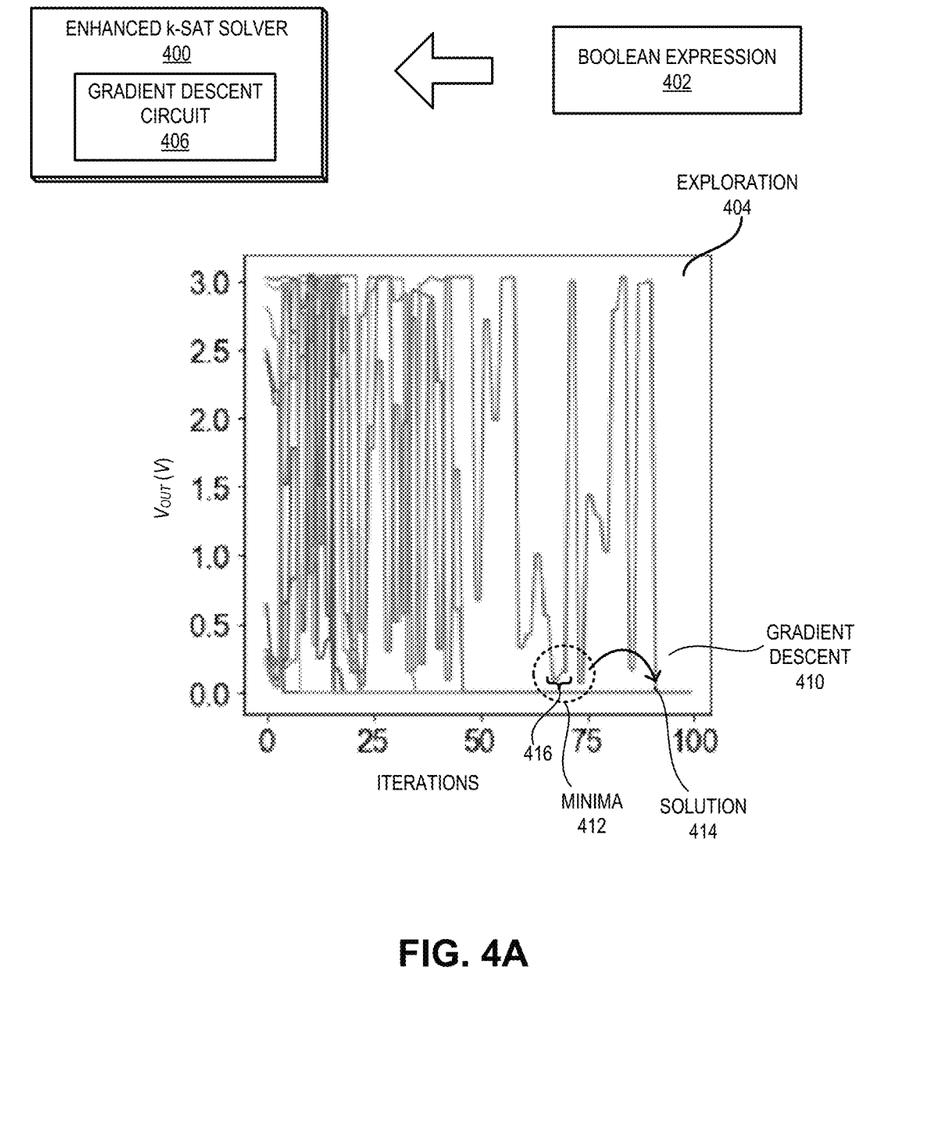
FIG. 4A illustrates exemplary impacts of gradient descent for an enhanced k-SAT problem solver, in accordance with an aspect of the present application.

FIG. 4A illustrates exemplary impacts of gradient descent for an enhanced k-SAT solver, in accordance with an aspect of the present application. An enhanced k-SAT solver 400 can be further enhanced using a gradient descent approach 410. If a Boolean expression 402 is large or complex, the exploration process of solver 400 may be unable to reach the target solution. In particular, solver 400 may not determine whether a solution corresponds to a local or global minima 412, or the distance to target solution 414. Gradient descent 410 can be applied for Boolean expression 402 based on an application process.

The application process can be based on one or more of: analytical computations for the derivatives of an expression based on the input/output relationship, applying an application-supported operation (e.g., AutoGrad in PyTorch), and using a gradient descent application circuit. For example, solver 400 can be equipped with a gradient descent circuit 406 for applying gradient descent during the exploration process 404 for the solution space for Boolean expression 402. Since solver 400 can directly track the energy and cost function at each iteration of the process, circuit 406 can efficiently apply gradient descent in the energy domain using the circuit.

Circuit 406 can add a noise based on a predetermined distribution to the input voltage when the output voltage does not improve over a predetermined number of iterations 416 (i.e., whenever the solution is not measured to improve after the predetermined number of cycles). This allows solver 400 to operate in the energy domain without requiring external computation for applying gradient descent 410. In this way, solver 400 can efficiently traverse the solution space for Boolean expression 402 in the energy domain, thereby avoiding extensive computation.

Figure 4B:
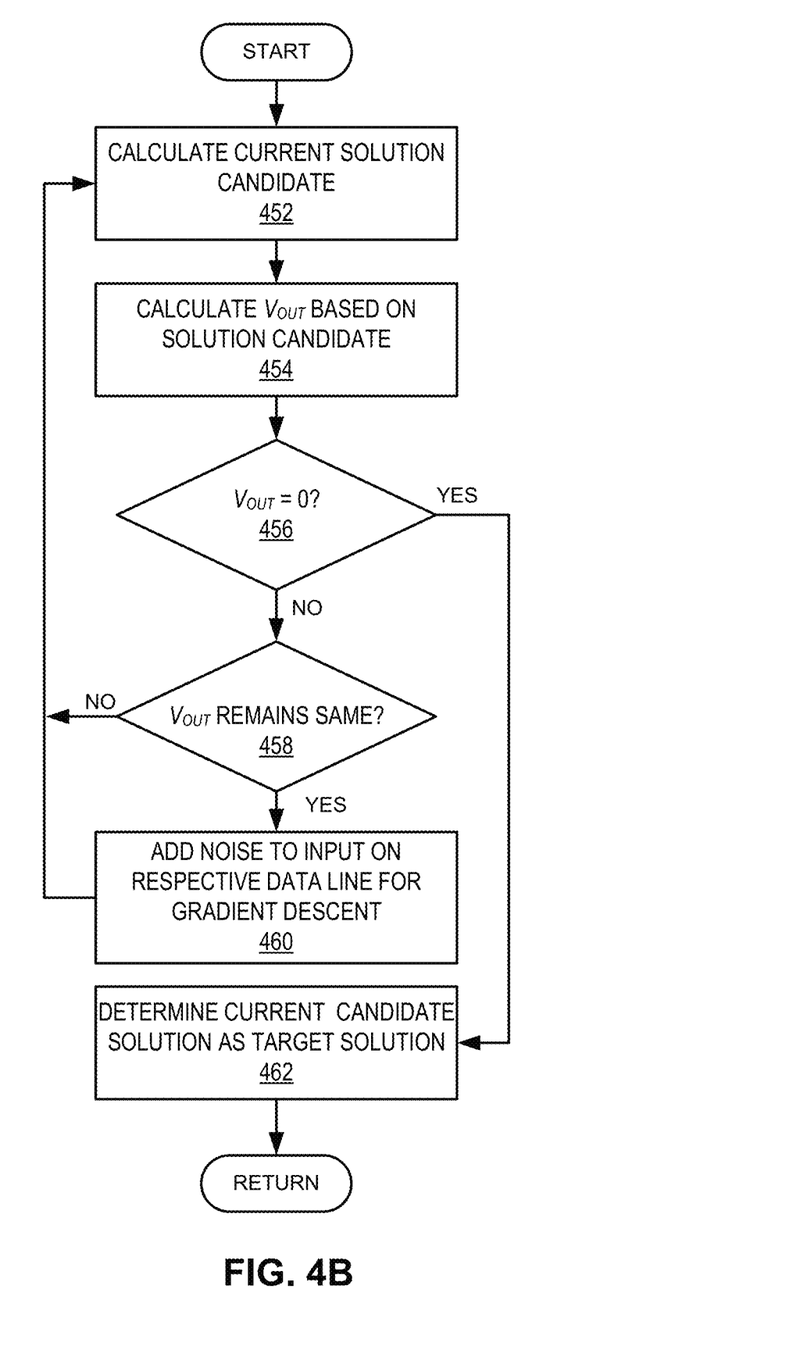
FIG. 4B presents a flowchart illustrating the process of an apparatus applying gradient descent for solving a k-SAT problem using aCAMs, in accordance with an aspect of the present application.

FIG. 4B presents a flowchart illustrating the process of an apparatus applying gradient descent for solving a k-SAT problem using aCAMs, in accordance with an aspect of the present application. The apparatus can include a k-SAT solver circuit and may traverse the solution space for a Boolean expression in a CNF form. During operation, the apparatus can calculate a current solution candidate (operation 452). The set of inputs provided via the data lines can form the solution candidate. The apparatus can then calculate $V_{OUT}$ based on the solution candidate (operation 454) and determine whether $V_{OUT}$ has reached a value of 0 (i.e., whether $V_{OUT}=0$) (operation 456).

If $V_{OUT}$ reaches a value of zero, the traversal is complete. Hence, the apparatus can determine the current candidate solution as the target solution (operation 462). On the other hand, if $V_{OUT}$ has not reached a value of 0, the apparatus can determine whether $V_{OUT}$ remains the same (operation 458). $V_{OUT}$ remaining the same can indicate local or global minima. Hence, if $V_{OUT}$ remains the same, the apparatus can add noise to the input on a respective data line for gradient descent (operation 460) (e.g., in association with operations 318 and 320 of FIG. 3). If $V_{OUT}$ is not the same (operation 458) or upon adding noise (operation 460), the apparatus can continue to calculate a current solution candidate (operation 452).

Figure 5A:
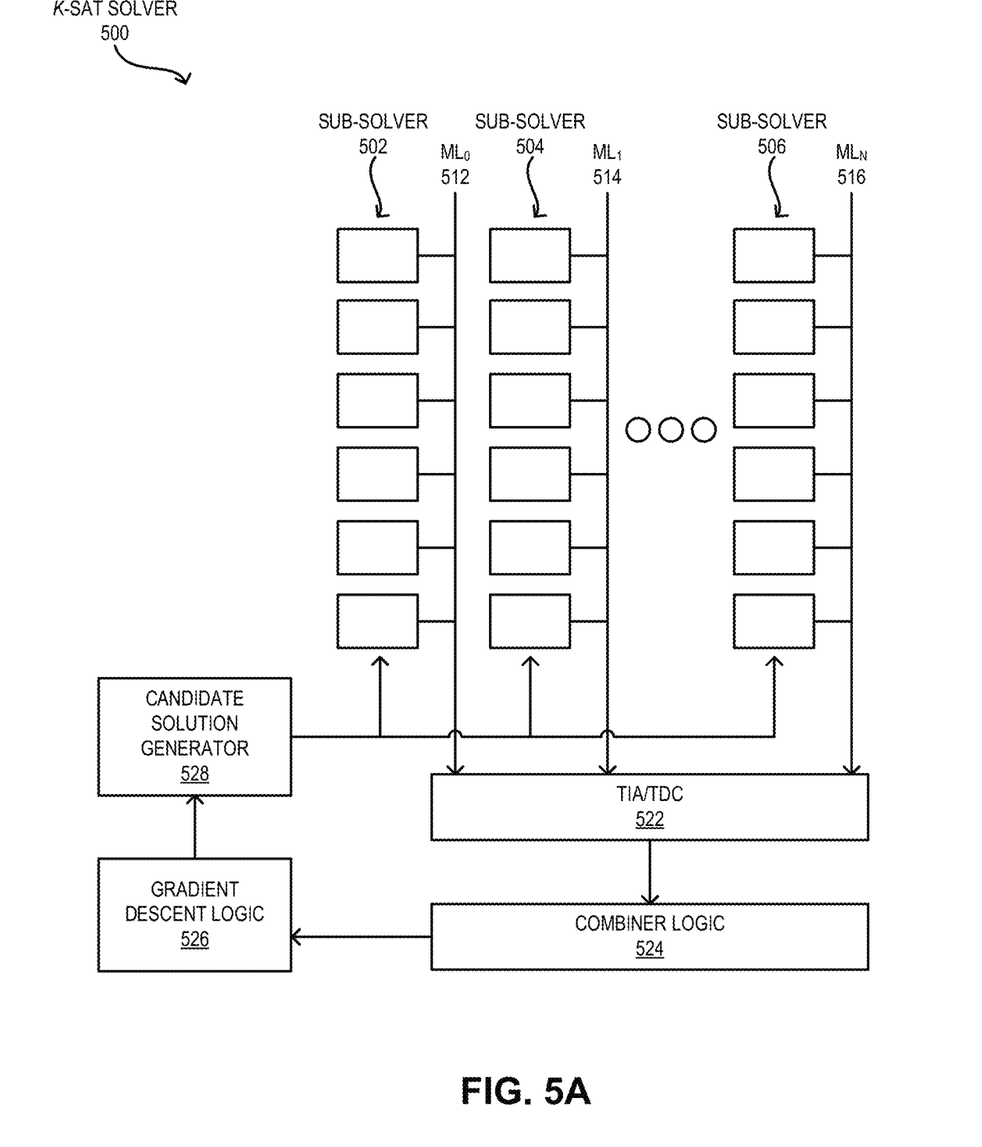
FIG. 5A illustrates an exemplary enhanced k-SAT problem solver formed based on a set of sub-solvers, in accordance with an aspect of the present application.

FIG. 5A illustrates an exemplary enhanced k-SAT solver formed based on a set of sub-solvers, in accordance with an aspect of the present application. Since inputs are shared among different aCAM cells, the cells representing different clauses can be organized based on rows or columns. For example, k-SAT solver 500 can include a set of sub-solvers 502, 504, and 506. A respective sub-solver can be formed with aCAM cells (or aCAMs). Match lines 512 ($ML_0$), 514 ($ML_1$), and 516 ($ML_2$) may correspond to sub-solvers 502, 504, and 506, respectively.

A TIA/TDC 522 can be used to determine the discharge time/current from match lines 512, 514, and 516. A combiner logic 524 can determine the overall discharge time/current by combining the measurements at TIA/TDC 522. Combiner logic 524 may sum the measurements to determine the overall energy or voltage output (i.e., $V_{OUT}$). Based on the overall energy, gradient descent logic 526 can be applied to the candidate solution generated by candidate solution generator 528. In this way, k-SAT solver 500 can be formed in a scalable way.

Figure 5B:
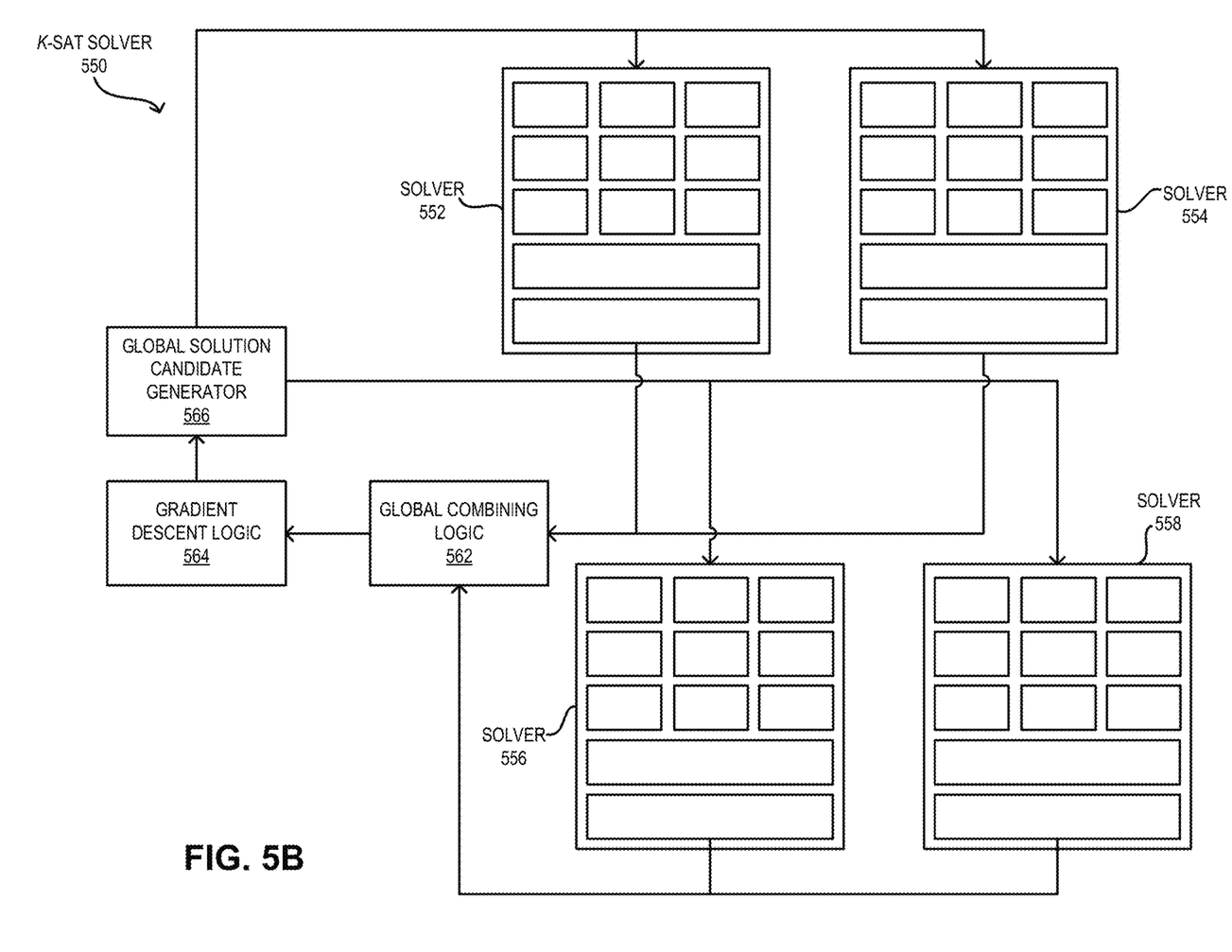
FIG. 5B illustrates exemplary scaling of enhanced k-SAT solvers, in accordance with an aspect of the present application.

FIG. 5B illustrates exemplary scaling of enhanced k-SAT solvers, in accordance with an aspect of the present application. A number of k-SAT solvers 552 554, 556, and 558 can be used to form a larger k-SAT solver 550. The discharge time/current from a respective solver can be combined by global combiner logic 562. Based on the output from global combiner logic 562, gradient descent logic 564 can be applied to the candidate solution generated by global candidate solution generator 566.

The set of candidate solutions generated by global candidate solution generator 566 can be provided to each of solvers 552 554, 556, and 558. Since the output of individual solvers can be combined in the energy domain, solvers 552 554, 556, and 558 can be combined to form a larger k-SAT solver 550. Hence, k-SAT solver 550 can be organized in a hierarchical array. Each of solvers 552 554, 556, and 558 can be considered as an element of the hierarchical array. Global combiner logic 562 can then determine the overall energy or voltage output, $V_{OUT}$, by adding respective outputs of the respective element of the hierarchical array.

Figure 6:
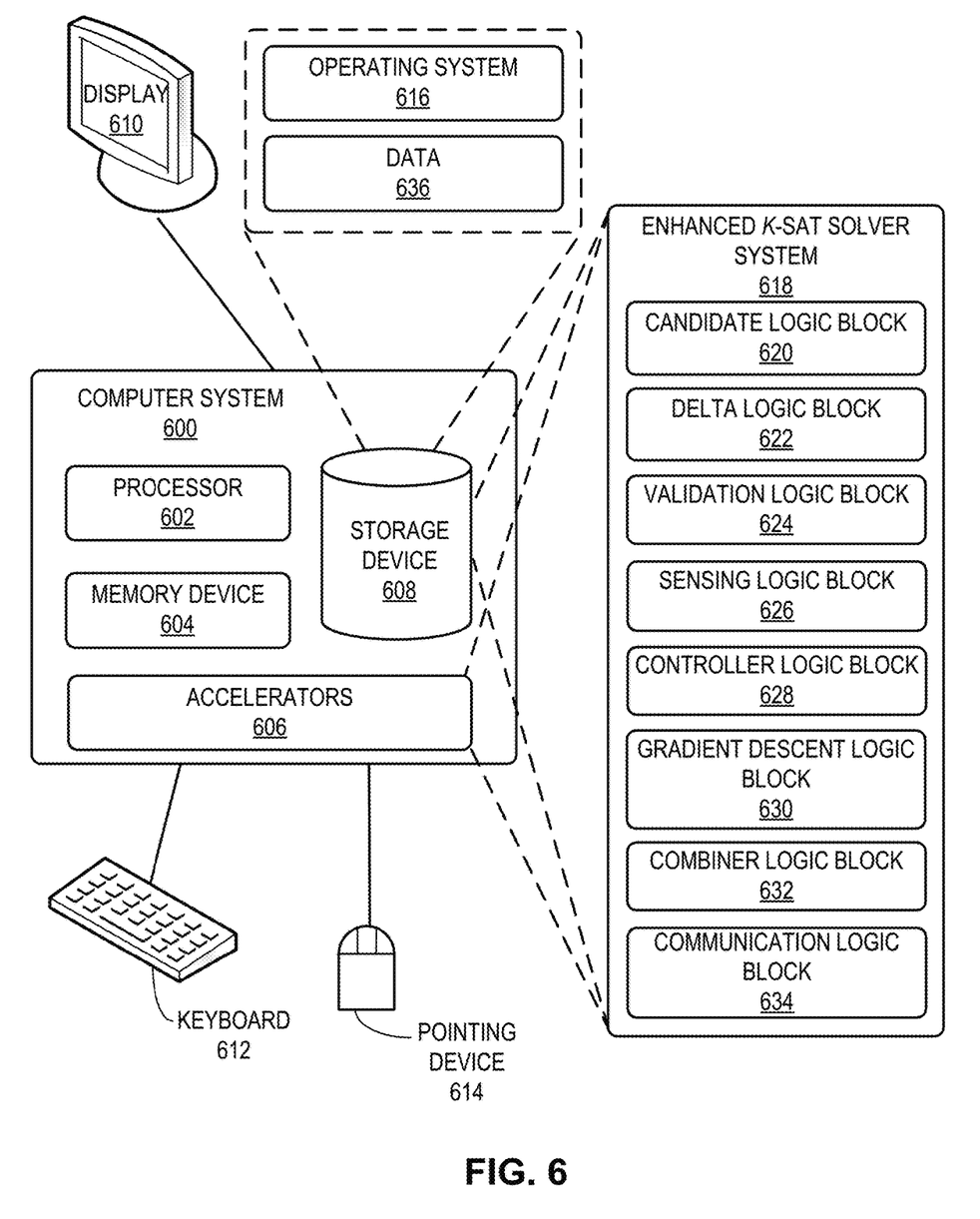
FIG. 6 illustrates an exemplary computer system supporting an enhanced k-SAT solver, in accordance with an embodiment of the present application.

FIG. 6 illustrates an exemplary computer system supporting an enhanced k-SAT solver, in accordance with an embodiment of the present application. Computer system 600 includes a processor 602, a memory 604, a set of hardware accelerators 606, and a storage device 608. Memory 604 can include volatile memory (e.g., a dual in-line memory module (DIMM)). Furthermore, computer system 600 can be coupled to a display device 610, a keyboard 612, and a pointing device 614. Storage device 608 can store an operating system 616 and data 636. An enhanced k-SAT solver system 618 can be facilitated as one of accelerators 606 or in storage device 608 as a software system. Enhanced k-SAT solver system 618 can facilitate the operations of solvers 150, 400, 500, and 550.

Enhanced k-SAT solver system 618 can include instructions, which when executed by computer system 600, can cause computer system 600 to perform methods and/or processes described in this disclosure. Enhanced k-SAT solver system 618 may also include pieces of hardware for executing as a hardware accelerator. Enhanced k-SAT solver system 618 can be programmed for exploring the solution space for a Boolean expression in CNF form and fining the solution.

Enhanced k-SAT solver system 618 can include instructions or a piece of hardware for determining candidate solution set (i.e., a set of inputs) for enhanced k-SAT solver system 618 (request logic block 620). Furthermore, enhanced k-SAT solver system 618 can include instructions or a piece of hardware for selecting an input and applying $\Delta V$ on the voltage corresponding to the input (e.g., the voltage on a corresponding data line) (delta logic block 622). Enhanced k-SAT solver system 618 can also include instructions or a piece of hardware for determining whether a correct solution for the Boolean expression is determined (validation logic block 624). Enhanced k-SAT solver system 618 can further include instructions or a piece of hardware for sensing the overall flow of current or discharge time in the energy domain (sensing logic block 626).

Enhanced k-SAT solver system 618 can further include instructions or a piece of hardware for determining whether to increase or decrease the input voltage by $\Delta V$ and whether to continue with the exploration (controller logic block 628). In addition, enhanced k-SAT solver system 618 can also include instructions or a piece of hardware for applying gradient descent (gradient descent logic block 630). Furthermore, Enhanced k-SAT solver system 618 can include instructions or a piece of hardware for combining aCAMs (combiner logic block 632). Moreover, enhanced k-SAT solver system 618 includes instructions for combining the flow of current or discharge time for the aCAMs in the energy domain (combiner logic block 632). Enhanced k-SAT solver system 618 can also include instructions for sending and receiving messages (communication logic block 634).

Data 636 can include any data that is required as input, or that is generated as output by the methods and/or processes described in this disclosure. Specifically, data 636 can include information associated with the Boolean expression and the input voltages at a respective iteration.

Figure 7:
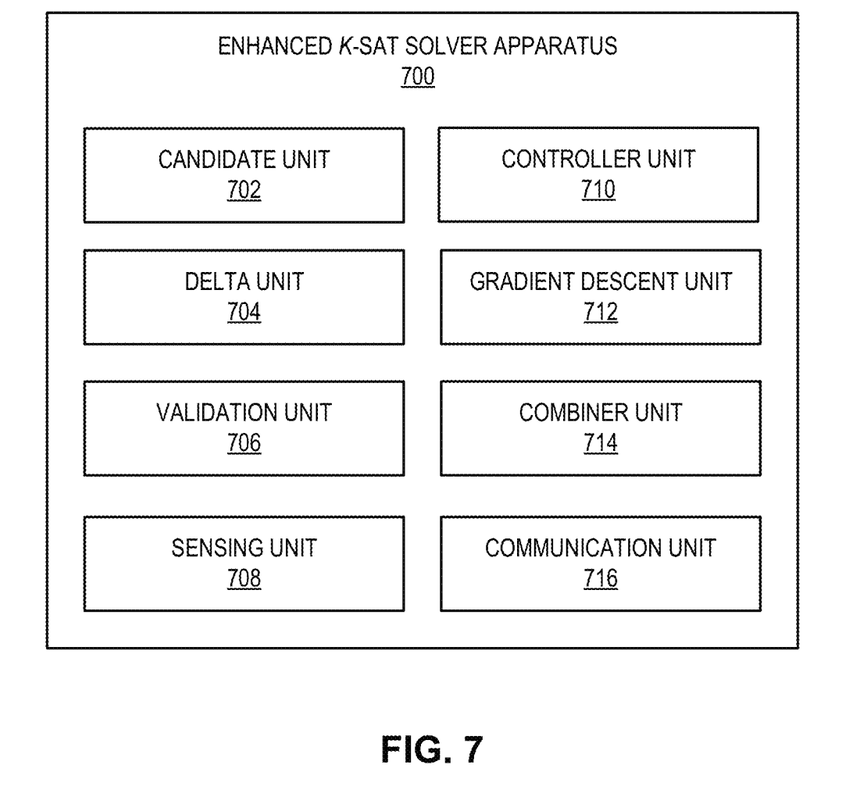
FIG. 7 illustrates an exemplary apparatus that facilitates an enhanced k-SAT solver, in accordance with an embodiment of the present application.

FIG. 7 illustrates an exemplary apparatus that facilitates an enhanced k-SAT solver, in accordance with an embodiment of the present application. Enhanced k-SAT solver apparatus 700 can comprise a plurality of units or apparatuses which may communicate with one another via a wired, wireless, quantum light, or electrical communication channel. Apparatus 700 may be realized using one or more integrated circuits, and may include fewer or more units or apparatuses than those shown in FIG. 6. Further, apparatus 700 may be integrated in a computer system, or realized as a separate device that is capable of communicating with other computer systems and/or devices. Apparatus 700 may also be a hardware accelerator.

Specifically, apparatus 700 can comprise units 702-716, which perform functions or operations similar to logic blocks 620-634 of computer system 600 of FIG. 6, including: a candidate unit 702; a delta unit 704; a validation unit 706; a sensing unit 708; a controller unit 710; a gradient descent unit 712; a combiner unit 714; and a communication unit 716.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disks, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

The methods and processes described herein can be executed by and/or included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

The foregoing descriptions of examples of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:

1. A computer-implemented method comprising:
programing a set of analog content addressable memory (aCAM) modules with respective analog values to represent an expression in a conjunctive normal form (CNF), wherein the set of aCAM modules receives input candidate values via a set of data lines;
determining a distance of a current solution from a target solution based on a combination of respective outputs from the set of aCAM modules; and
iteratively modifying an input value for a subset of the set of data lines until the current solution converges based on a convergence condition.

2. The method of claim 1, wherein the distance comprises a voltage distance, and wherein the convergence condition comprises a voltage value of zero calculated based on the respective outputs.

3. The method of claim 1, wherein an aCAM module of the set of aCAM modules comprises a plurality of aCAM cells, and wherein an aCAM cell of the plurality of aCAM cells is associated with a variable of a clause of the expression indicated by the aCAM module.

4. The method of claim 3, wherein the aCAM cell comprises one or more tunable resistance devices (TRDs), wherein a TRD of the one or more TRDs facilitates non-volatile storage of continuous analog value.

5. The method of claim 4, wherein the TRD comprises one of:
a memristor;
a memtransistor; and
a memory component in a neuromorphic memory device.

6. The method of claim 1, further comprising determining whether modifying the input value decreases the distance from the target solution based on the combination of the respective outputs.

7. The method of claim 6, further comprising increasing or decreasing the input value in response to sensing an increased distance from the target solution.

8. The method of claim 1, further comprising incorporating noise to the input candidate values responsive to a combination of the respective outputs not changing for a number of iterations.

9. The method of claim 1, wherein the set of aCAM modules are organized in a hierarchical array, wherein a respective element of the hierarchical array comprises the subset of the aCAM modules.

10. The method of claim 9, further comprising determining the combination of the respective outputs by adding respective outputs of the respective element of the hierarchical array.

11. A non-transitory computer-readable medium storing a set of instructions, the set of instructions comprising:
one or more instructions that, when executed by one or more processors cause the processors to:
program a set of analog content addressable memory (aCAM) modules with respective analog values to represent an expression in a conjunctive normal form (CNF), wherein the set of aCAM modules receives input candidate values via a set of data lines;

determine a distance of a current solution from a target solution based on a combination of respective outputs from the set of aCAM modules; and iteratively modify an input value for a subset of the set of data lines until the current solution converges based on a convergence condition.

12. The non-transitory computer-readable medium of claim 11, wherein the distance comprises a voltage distance, and the convergence condition comprises a voltage value of zero calculated based on the respective outputs.

13. The non-transitory computer-readable medium of claim 11, wherein an aCAM module of the set of aCAM modules comprises a plurality of aCAM cells, and wherein an aCAM cell of the plurality of aCAM cells is associated with a variable of a clause of the expression indicated by the aCAM module.

14. The non-transitory computer-readable medium of claim 13, wherein the aCAM cell comprises one or more tunable resistance devices (TRDs), a TRD of the one or more TRDs facilitates non-volatile storage of continuous analog value.

15. The non-transitory computer-readable medium of claim 14, wherein the TRD comprises one of:
a memristor;
a memtransistor; and
a memory component in a neuromorphic memory device.

16. The non-transitory computer-readable medium of claim 11, wherein the one or more instructions further cause the processors to determine whether modifying the input value decreases the distance from the target solution based on the combination of the respective outputs.

17. The non-transitory computer-readable medium of claim 16, wherein the one or more instructions further cause the processors to increase or decreasing the input value in response to sensing an increased distance from the target solution.

18. The non-transitory computer-readable medium of claim 11, wherein the one or more instructions further cause the processors to incorporate noise to the input candidate values responsive to a combination of the respective outputs not changing for a number of iterations.

19. The non-transitory computer-readable medium of claim 11, wherein the set of aCAM modules are organized in a hierarchical array, a respective element of the hierarchical array comprises the subset of the aCAM modules.

20. The non-transitory computer-readable medium of claim 19, wherein the one or more instructions further cause the processors to determine the combination of the respective outputs by adding respective outputs of the respective element of the hierarchical array.

* * * * *